(12) United States Patent
Frushour

(10) Patent No.: US 7,595,110 B2
(45) Date of Patent: Sep. 29, 2009

(54) POLYCRYSTALLINE DIAMOND COMPOSITE

(76) Inventor: Robert H. Frushour, 2313 Devonshire, Ann Arbor, MI (US) 48104

( * ) Notice: Subject to any disclaimer, the term of this patent is extended or adjusted under 35 U.S.C. 154(b) by 654 days.

(21) Appl. No.: 10/940,562

(22) Filed: Sep. 14, 2004

(65) Prior Publication Data
US 2005/0079358 A1    Apr. 14, 2005

Related U.S. Application Data

(60) Provisional application No. 60/509,443, filed on Oct. 8, 2003.

(51) Int. Cl.
B32B 9/00 (2006.01)
(52) U.S. Cl. .................... 428/408; 423/446; 427/372.2; 427/377; 428/704
(58) Field of Classification Search .............. 428/408, 428/704; 423/446; 427/372.2, 377
See application file for complete search history.

(56) References Cited

U.S. PATENT DOCUMENTS

| | | | |
|---|---|---|---|
| 2,077,345 A | 4/1937 | Van der Pyl | |
| 2,137,200 A | 11/1938 | Boyer | |
| 2,137,201 A | 11/1938 | Boyer | |
| 2,173,833 A | 9/1939 | Fitz-Randolph | |
| 2,238,351 A | 4/1941 | Van der Pyl | |
| 2,270,209 A | 1/1942 | Van der Pyl | |
| 2,561,709 A | 7/1951 | Norling | |
| 2,828,197 A | 3/1958 | Blackman, Jr. | |
| 2,944,323 A | 7/1960 | Stadler | |
| 2,947,610 A | 8/1960 | Hall | |
| 2,992,900 A | 7/1961 | Bovenkerk | |
| 3,087,803 A | 4/1963 | Bakian | |
| 3,141,746 A | 7/1964 | De Lai | |
| 3,192,620 A | 7/1965 | Huiziny | |
| 3,233,988 A | 2/1966 | Wentorf, Jr. | |
| 3,369,879 A | 2/1968 | Miller | |
| 3,517,464 A | 6/1970 | Mattia | |
| 3,609,818 A | 10/1971 | Wentorf, Jr. | |
| 3,637,360 A | 1/1972 | Ueltz | |
| 3,645,706 A | 2/1972 | Bovenkerk | |
| 3,743,489 A | 7/1973 | Wentorf, Jr. | |
| 3,745,623 A | 7/1973 | Wentorf, Jr. | |
| 3,767,371 A | 10/1973 | Wentorf, Jr. | |
| 3,902,873 A | 9/1975 | Hughes | |
| 3,904,391 A | 9/1975 | Lindstrom | |
| 3,913,280 A | 10/1975 | Hall | |
| 4,034,066 A * | 7/1977 | Strong et al. ................. 423/446 |
| 4,041,650 A | 8/1977 | Sawluk | |
| 4,042,673 A * | 8/1977 | Strong ........................ 423/446 |
| 4,104,344 A | 8/1978 | Pope | |
| 4,109,737 A | 8/1978 | Bovenkerk | |
| 4,156,329 A | 5/1979 | Daniel | |
| 4,224,380 A | 9/1980 | Bovenkerk | |

(Continued)

*Primary Examiner*—Archene Turner
(74) *Attorney, Agent, or Firm*—Young Basile Hanlon & Macfarlane

(57) ABSTRACT

An apparatus and method of forming a composite body including the steps of forming a diamond material layer having a first surface from diamond crystals having a nitrogen content of less than 100 ppm; providing a substrate; and bonding the first surface of the diamond material layer and the substrate under high pressure and high temperature. The composite body has a diamond material layer formed from diamond crystals having a nitrogen content of less than 100 ppm. The diamond material layer has a first surface and a substrate. The first surface of the diamond material layer and the substrate are bonded together under high pressure and high temperature.

15 Claims, 1 Drawing Sheet

U.S. PATENT DOCUMENTS

| | | | |
|---|---|---|---|
| 4,225,322 A | 9/1980 | Knemeyer | |
| 4,229,186 A | 10/1980 | Wilson | |
| 4,239,501 A | 12/1980 | Wirth | |
| 4,239,502 A | 12/1980 | Slack | |
| 4,259,090 A | 3/1981 | Bovenkerk | |
| 4,260,397 A | 4/1981 | Bovenkerk | |
| 4,268,276 A | 5/1981 | Bovenkerk | |
| 4,278,448 A | 7/1981 | Ishizuka | |
| 4,311,490 A | 1/1982 | Bovenkerk | |
| 4,322,396 A | 3/1982 | Strong | |
| 4,339,896 A | 7/1982 | Dennis | |
| 4,350,215 A | 9/1982 | Radtke | |
| 4,378,233 A | 3/1983 | Carver | |
| 4,411,672 A | 10/1983 | Ishizuka | |
| 4,481,016 A | 11/1984 | Campbell | |
| 4,481,180 A | 11/1984 | Bedere | |
| 4,496,372 A | 1/1985 | Almond | |
| 4,505,721 A | 3/1985 | Almond | |
| 4,522,633 A | 6/1985 | Dyer | |
| 4,592,433 A | 6/1986 | Dennis | |
| 4,604,106 A | 8/1986 | Hall | |
| 4,626,407 A | 12/1986 | Veltri | |
| 4,629,373 A | 12/1986 | Hall | |
| RE32,380 E | 3/1987 | Wentorf, Jr. | |
| 4,661,180 A | 4/1987 | Frushour | |
| 4,662,896 A | 5/1987 | Dennis | |
| 4,670,025 A | 6/1987 | Pipkin | |
| 4,686,080 A | 8/1987 | Hara | |
| 4,705,123 A | 11/1987 | Dennis | |
| 4,716,975 A | 1/1988 | Dennis | |
| 4,776,861 A | 10/1988 | Frushour | |
| 4,784,023 A | 11/1988 | Dennis | |
| 4,789,385 A | 12/1988 | Dyer | |
| 4,802,895 A | 2/1989 | Burnand | |
| 4,828,582 A | 5/1989 | Frushour | |
| 4,866,885 A | 9/1989 | Dodsworth | |
| 4,871,377 A | 10/1989 | Frushour | |
| 4,875,907 A | 10/1989 | Phaal | |
| 4,954,139 A | 9/1990 | Cerutti | |
| 4,972,637 A | 11/1990 | Dyer | |
| 4,988,554 A | 1/1991 | Peterson | |
| 5,007,207 A | 4/1991 | Phaal | |
| 5,011,509 A | 4/1991 | Frushour | |
| 5,011,515 A | 4/1991 | Frushour | |
| 5,014,468 A | 5/1991 | Ravipati | |
| 5,032,147 A | 7/1991 | Frushour | |
| 5,049,164 A | 9/1991 | Horton | |
| 5,054,246 A | 10/1991 | Phaal | |
| 5,120,327 A | 6/1992 | Dennis | |
| 5,133,332 A * | 7/1992 | Tanaka et al. | 51/293 |
| 5,190,734 A | 3/1993 | Frushour | |
| 5,351,772 A | 10/1994 | Smith | |
| 5,355,969 A | 10/1994 | Hardy | |
| 5,379,854 A | 1/1995 | Dennis | |
| 5,449,388 A | 9/1995 | Wiand | |
| 5,469,927 A | 11/1995 | Griffin | |
| 5,564,511 A | 10/1996 | Frushour | |
| 5,598,750 A | 2/1997 | Griffin | |
| 5,645,617 A | 7/1997 | Frushour | |
| 5,981,057 A * | 11/1999 | Collins | 428/408 |
| 6,030,595 A * | 2/2000 | Sumiya et al. | 423/446 |
| 6,187,068 B1 | 2/2001 | Frushour | |
| 6,582,513 B1 * | 6/2003 | Linares et al. | 423/446 |
| 6,846,341 B2 * | 1/2005 | Middlemiss | 51/307 |

* cited by examiner

POLYCRYSTALLINE DIAMOND COMPOSITE

CROSS REFERENCE

This application claims the benefit of the Oct. 8, 2003 filing date of U.S. Provisional Application No. 60/509,443, the entire contents of which are hereby incorporated by reference.

BACKGROUND

The present invention relates to a sintered polycrystalline diamond composite for use in rock drilling, machining of wear resistant materials, and other operations which require the high abrasion resistance or wear resistance of a diamond surface. Specifically, this invention relates to such composite bodies which comprise a polycrystalline diamond layer attached to a cemented metal carbide substrate via processing at ultrahigh pressures and temperatures.

It is well known to sinter a mass of crystalline particles such as diamond or cubic boron nitride in the presence of a suitable solvent catalyst by means of a high pressure, high temperature apparatus to form a compact with good particle-to-particle bonding. Typically the diamond is a synthetic industrial grade diamond with a nitrogen content above 1000 ppm. It is also well known that use of diamond particles smaller in size result in a compact with higher abrasion resistance when used to machine or drill certain materials such as rock. However, there is a limit as to how fine a particle size becomes useful since the impact strength and thermal stability of a compact are reduced as the diamond particle size becomes smaller. Such composite compacts are widely used in machining and drilling since the carbide substrate provides good mechanical support and can be clamped or brazed to a suitable tool holder or drilling bit.

It would be useful if the wear life of a compact could be extended without giving up impact resistance as happens with smaller diamond particle size or by having to make the diamond layer thicker which increases the stress in the compact leading to early catastrophic failure due to cracking or delmination.

SUMMARY

The present invention pertains to an apparatus and method of forming a composite body including the steps of forming a diamond material layer having a first surface from diamond crystals having a nitrogen content of less than 100 ppm; providing a substrate; and bonding the first surface of the diamond material layer and the substrate under high pressure and high temperature.

The composite body has a diamond material layer formed from diamond crystals having a nitrogen content of less than 100 ppm. The diamond material layer has a first surface and a substrate. The first surface of the diamond material layer and the substrate are bonded together under high pressure and high temperature.

BRIEF DESCRIPTION OF THE DRAWING

The various features, advantages and other uses of the present invention will become more apparent by referring to the following detailed description and drawing in which.

DETAILED DESCRIPTION

Figure 1:
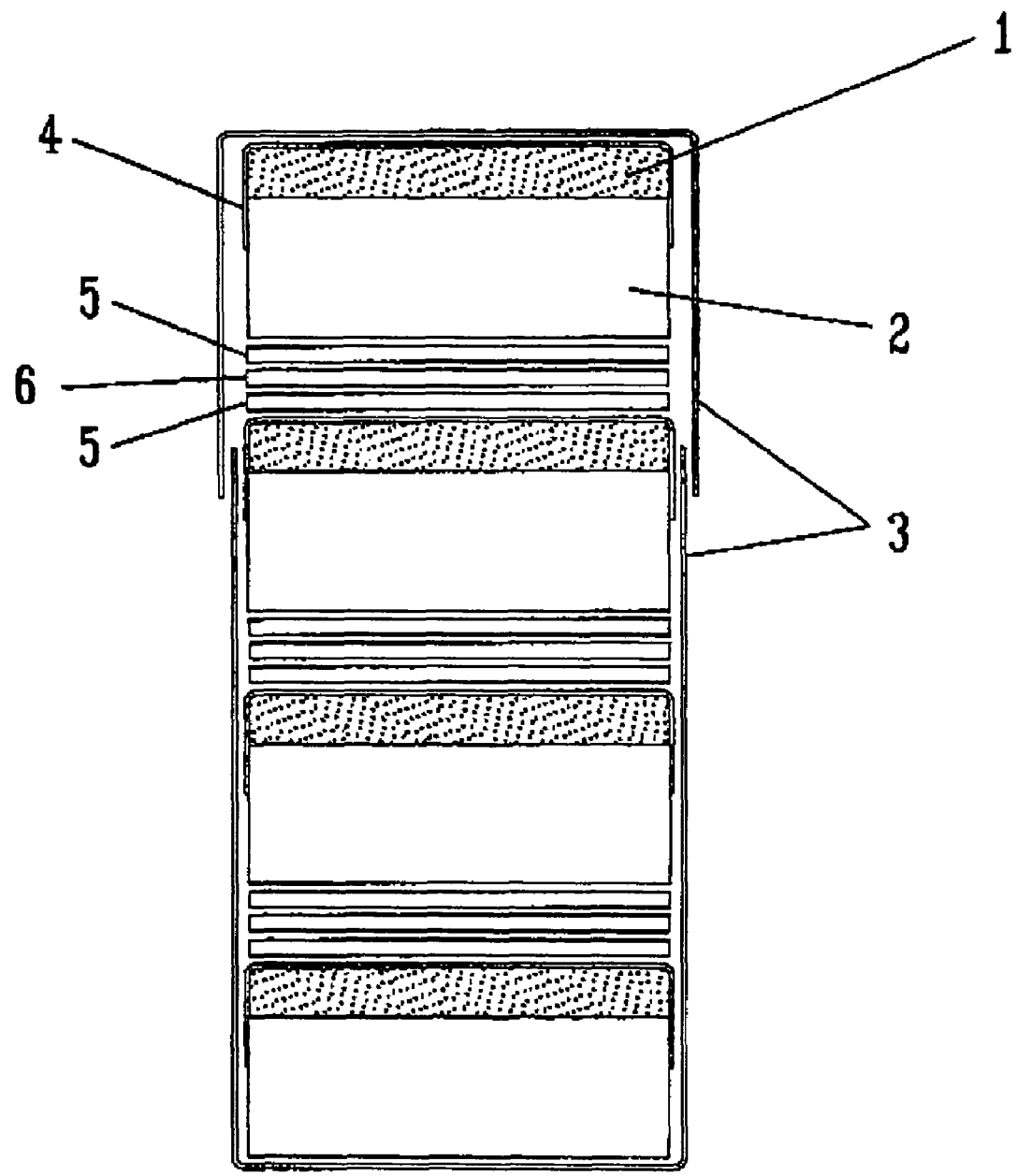
FIG. 1 is a cross-sectional view of the inner portion of a high pressure cell which may be used to make a diamond compact according to the present invention.

A diamond material is manufactured by chemical vapor deposition under conditions that limit nitrogen absorption into the diamond crystals. This material can be grown by any of the CVD techniques now being used, such as plasma assisted or heated filament methods. These low pressure methods of making the diamond layer are preferable since they can produce diamond with low nitrogen content. This low-nitrogen diamond shows a higher degree of abrasion resistance than diamonds currently being manufactured by high pressure manufacturing processes. The diamond is typically crushed, sized and then cleaned in a hydrogen furnace for about 1 hour at about 900° C. This diamond feed stock can be used by any of the well-known high pressure, high temperature manufacturing processes to produce a PDC cutter.

In the following description and claims, it should be understood that a cemented metal carbide substrate refers to a carbide of one of the group IVB, VB or VIB metals which is pressed and sintered in the presence of a binder of cobalt, nickel, or iron and the alloys thereof.

FIG. 1 shows a cross section of an inner portion of an assembly which may be employed to make the composite polycrystalline diamond body of the present invention.

A diamond material 1 is placed into a protective metal cup 4 then a substrate, or support 2 is placed into the cup 4 on top of the diamond material 1.

An enclosure 3 is cylindrical in shape and is designed to fit within a central cavity of an ultrahigh pressure and temperature cell, such as that described in U.S. Pat. No. 3,745,623 or U.S. Pat. No. 3,913,280.

The enclosure 3 is composed of a metal, such as zirconium, molybdenum, or tantalum, which is selected because of its high melting temperature and designed to protect the reaction zone from moisture and other harmful impurities present in a high pressure and high temperature environment. The cup 4 is also made of a metal, such as zirconium, molybdenum, or tantalum, and designed to provide additional protection to the sample if the outer enclosure should fail. Discs 5 are fabricated from either zirconium or molybdenum and disc 6 is composed of fired mica, salt, boron nitride, or zirconium oxide and is used as a separator so that the composite bodies can be easily divided.

Typically, the metal carbide support 2 will be composed of tungsten carbide with a 13 weight percent cobalt binder.

The entire cell is subjected to pressures in excess of 40 K-bars and heated in excess of about 1400° C. for a time of about 10 minutes. Then the cell is allowed to cool enough so that the diamond does not back-convert to graphite when the pressure is released.

After pressing, the samples are lapped and ground to remove all the protective metals of the enclosure, cup and discs of 3, 4, 5, and 6.

Finished parts are mounted on to tool shanks or drill bit bodies by well-known methods, such as brazing, LS bonding, mechanical interference fit, etc., and find use in such applications as, machining high silicon aluminum, brass, composite materials, rock, or any application where excessive temperatures may result in thermal degradation of the diamond cutting edge.

EXAMPLE 100 carats of CVD diamond material with a nitrogen content of less than 1 ppm and with an average particle size of 25 microns is cleaned in a hydrogen atmosphere at 900° C. for one hour. The cleaned diamond thus produced is used as a feed stock to manufacture a PDC cutter by known high pressure, high temperature techniques.

What is claimed is:

1. A composite body comprising:
    a diamond material layer formed from diamond crystals that have been manufactured, having a nitrogen content of less than 100 ppm, the diamond material layer having a first surface;
    a substrate; and
    the first surface of the diamond material layer and the substrate bonded together under high pressure and high temperature, wherein the composite body resist wear and stress cracking.

2. The composite body of claim 1 wherein the diamond crystals have a nitrogen content less than 1 ppm.

3. The composite body of claim 1 wherein the diamond crystals have a nitrogen content less than 10 ppm.

4. The composite body of claim 3 wherein the diamond material layer is formed of CVD process manufactured diamond crystals.

5. The composite body of claim 3 wherein the diamond material layer is formed of high temperature carbon deposition formed diamond crystals.

6. The composite body of claim 3 wherein the diamond material layer is formed of diamond crystals that have been manufactured by a process using a nitrogen attractive material to limit the nitrogen content of the diamond crystals.

7. The composite body of claim 3 wherein the diamond material layer is formed of natural type IIA diamond crystals.

8. A composite body formed by a process including the steps of forming a diamond material layer having a first surface from diamond crystals having a nitrogen content of less than 100 ppm, providing a substrate, and bonding the first surface of the diamond material layer and the substrate under high pressure and high temperature, the composite body comprising:
    a diamond material layer formed from that have been manufactured having a nitrogen content of less than 100 ppm, the diamond material having a first surface;
    a substrate; and
    the first surface of the diamond material layer and the substrate bonded together under high pressure and high temperature.

9. A method of forming a composite body comprising the steps of:
    forming a diamond material layer having a first surface from diamond crystals having a nitrogen content of less than 100 ppm;
    providing a substrate; and
    bonding the first surface of the diamond material layer and the substrate under high pressure and high temperature.

10. The method of claim 9 wherein the step of forming the diamond material layer further comprises the step of:
    forming the diamond crystals with a nitrogen content less than 10 ppm.

11. The method of claim 9 wherein the step of forming the diamond material layer further comprises the step of:
    forming the diamond crystals with a nitrogen content of 1.0 ppm.

12. The method of claim 9 wherein the step of forming the diamond material layer further comprises the step of:
    forming the diamond material layer of diamond crystals that have been manufactured using a CVD process.

13. The method of claim 9 wherein the step of forming the diamond material layer further comprises the step of:
    using high temperature carbon deposition to form the diamond crystals of the diamond material layer.

14. The method of claim 9 wherein the step of forming the diamond material layer further comprises the step of:
    forming the diamond crystals by a process using a nitrogen attractive material to limit the nitrogen content of the diamond crystals.

15. The method of claim 9 wherein the step of forming the diamond material layer further comprises the step of:
    forming the diamond material layer of Type IIA diamond crystals.

* * * * *